(12) United States Patent
Chopra et al.

(10) Patent No.: US 11,510,314 B2
(45) Date of Patent: Nov. 22, 2022

(54) HYBRID NANOSILVER/LIQUID METAL INK COMPOSITION AND USES THEREOF

(71) Applicant: XEROX CORPORATION, Norwalk, CT (US)

(72) Inventors: Naveen Chopra, Oakville (CA); Barkev Keoshkerian, Thornhill (CA); Chad Steven Smithson, Toronto (CA); Kurt I. Halfyard, Mississauga (CA); Michelle N. Chretien, Mississauga (CA)

(73) Assignee: XEROX CORPORATION, Norwalk, CT (US)

( * ) Notice: Subject to any disclaimer, the term of this patent is extended or adjusted under 35 U.S.C. 154(b) by 579 days.

(21) Appl. No.: 16/573,590

(22) Filed: Sep. 17, 2019

(65) Prior Publication Data
US 2020/0015354 A1 Jan. 9, 2020

Related U.S. Application Data

(62) Division of application No. 15/439,754, filed on Feb. 22, 2017, now Pat. No. 10,492,297.

(51) Int. Cl.
*H05K 1/05* (2006.01)
*H05K 3/34* (2006.01)
(Continued)

(52) U.S. Cl.
CPC ............. *H05K 1/097* (2013.01); *C09D 11/03* (2013.01); *C09D 11/037* (2013.01); *C09D 11/30* (2013.01);
(Continued)

(58) Field of Classification Search
CPC .......... H05K 1/005; H05K 1/097; H05K 1/11; H05K 3/34; H05K 3/125; H05K 3/341;
(Continued)

(56) References Cited

U.S. PATENT DOCUMENTS 4,174,244 A 11/1979 Thomas et al.
6,289,809 B1 9/2001 Sonobe
(Continued)

FOREIGN PATENT DOCUMENTS

EP 1428673 A1 6/2004
EP 3248804 A1 11/2017
(Continued)

OTHER PUBLICATIONS

Author unknown, "Silicone Rubber Material Specifications," downloaded Jun. 17, 2019 from https://www.exonicpolymers.com/articles.aspID=266, 5 pages.
(Continued)

*Primary Examiner* — Xiaoliang Chen
(74) *Attorney, Agent, or Firm* — MH2 Technology Law Group LLP

(57) ABSTRACT

The present disclosure is directed to a hybrid conductive ink including: silver nanoparticles and eutectic low melting point alloy particles, wherein a weight ratio of the eutectic low melting point alloy particles and the silver nanoparticles ranges from 1:20 to 1:5. Also provided herein are methods of forming an interconnect including a) depositing a hybrid conductive ink on a conductive element positioned on a substrate, wherein the hybrid conductive ink comprises silver nanoparticles and eutectic low melting point alloy particles, the eutectic low melting point alloy particles and the silver nanoparticles being in a weight ratio from about 1:20 to about 1:5; b) placing an electronic component onto the hybrid conductive ink; c) heating the substrate, conductive element, hybrid conductive ink and electronic component to a temperature sufficient i) to anneal the silver nanoparticles in the hybrid conductive ink and ii) to melt the low melting point eutectic alloy particles, wherein the melted low melting point eutectic alloy flows to occupy
(Continued)

spaces between the annealed silver nanoparticles, d) allowing the melted low melting point eutectic alloy of the hybrid conductive ink to harden and fuse to the electronic component and the conductive element, thereby forming an interconnect. Electrical circuits including conductive traces and, optionally, interconnects formed with the hybrid conductive ink are also provided.

8 Claims, 9 Drawing Sheets

(51) Int. Cl.
| | |
|---|---|
| C09D 11/02 | (2014.01) |
| C09D 11/03 | (2014.01) |
| C09D 11/037 | (2014.01) |
| C09D 11/30 | (2014.01) |
| C09D 11/38 | (2014.01) |
| C09D 11/52 | (2014.01) |
| C09D 11/322 | (2014.01) |
| H01B 1/02 | (2006.01) |
| H01B 1/16 | (2006.01) |
| H01B 1/22 | (2006.01) |
| H05K 1/09 | (2006.01) |
| H01L 23/00 | (2006.01) |
| H01L 23/498 | (2006.01) |

(52) U.S. Cl.
CPC .............. *C09D 11/52* (2013.01); *H01B 1/02* (2013.01); *H01B 1/16* (2013.01); *H01B 1/22* (2013.01); *H01L 23/4985* (2013.01); *H01L 23/49838* (2013.01); *H01L 23/49894* (2013.01); *H01L 24/29* (2013.01); *H01L 24/32* (2013.01); *H01L 24/75* (2013.01); *H01L 24/83* (2013.01); *H05K 3/3457* (2013.01); *H01L 2224/29239* (2013.01); *H01L 2224/32227* (2013.01); *H01L 2224/75155* (2013.01); *H01L 2224/8384* (2013.01); *H01L 2924/1203* (2013.01); *H01L 2924/1304* (2013.01); *H01L 2924/14* (2013.01); *H05K 3/3431* (2013.01); *H05K 3/3485* (2020.08); *H05K 3/3494* (2013.01); *H05K 2201/0257* (2013.01)

(58) Field of Classification Search
CPC .. H05K 3/3457; H05K 3/3485; H05K 3/3489; C09D 11/02; C09D 11/03; C09D 11/037; C09D 11/30; C09D 11/38; C09D 11/52; C09D 11/322; H01B 1/02; H01B 1/16; H01B 1/22
USPC ....... 174/257; 427/99.2, 123, 125, 190, 595; 106/31.13
See application file for complete search history.

(56) References Cited

U.S. PATENT DOCUMENTS

| | | | |
|---|---|---|---|
| 6,688,226 B2 | 2/2004 | Rossini et al. | |
| 8,158,032 B2* | 4/2012 | Liu | C09D 11/322 |
| | | | 252/514 |
| 8,586,871 B2 | 11/2013 | Bernstein et al. | |
| 8,834,965 B2 | 9/2014 | Mokhtari et al. | |
| 9,950,549 B2 | 4/2018 | Kanungo et al. | |
| 2003/0233953 A1 | 12/2003 | Pan et al. | |
| 2004/0175550 A1 | 9/2004 | Lawrence et al. | |
| 2005/0285084 A1* | 12/2005 | Fujii | C09D 11/30 |
| | | | 252/500 |
| 2007/0221404 A1 | 9/2007 | Das et al. | |
| 2009/0142481 A1* | 6/2009 | Chopra | C09D 11/38 |
| | | | 106/31.13 |
| 2009/0226605 A1* | 9/2009 | Chopra | H05K 3/125 |
| | | | 427/125 |
| 2009/0288517 A1* | 11/2009 | Chretien | C09D 11/52 |
| | | | 977/777 |
| 2009/0301344 A1* | 12/2009 | Chretien | B22F 9/24 |
| | | | 427/595 |
| 2010/0009153 A1* | 1/2010 | Yang | H01B 1/22 |
| | | | 428/220 |
| 2010/0143591 A1 | 6/2010 | Wu et al. | |
| 2012/0103212 A1 | 5/2012 | Stowe et al. | |
| 2012/0103216 A1 | 5/2012 | Knisel et al. | |
| 2015/0070454 A1 | 3/2015 | Moorlag et al. | |
| 2015/0240100 A1 | 8/2015 | Liu et al. | |
| 2015/0240101 A1 | 8/2015 | Chopra et al. | |
| 2015/0291847 A1 | 10/2015 | Condello et al. | |
| 2016/0176185 A1 | 6/2016 | Kanungo et al. | |
| 2016/0236500 A1 | 8/2016 | Fu et al. | |
| 2017/0015115 A1 | 1/2017 | Chen et al. | |
| 2017/0341452 A1 | 11/2017 | Kanungo et al. | |
| 2018/0050532 A1 | 2/2018 | Stowe et al. | |
| 2018/0063967 A1* | 3/2018 | Morales | H05K 3/341 |
| 2019/0019594 A1* | 1/2019 | Ishii | C22C 13/02 |
| 2019/0322114 A1 | 10/2019 | Sambhy et al. | |
| 2020/0282759 A1 | 9/2020 | Sambhy et al. | |
| 2020/0353770 A1 | 11/2020 | Sambhy et al. | |
| 2021/0016590 A1 | 1/2021 | Sambhy et al. | |
| 2021/0284851 A1 | 9/2021 | Birau et al. | |

FOREIGN PATENT DOCUMENTS

| | | |
|---|---|---|
| EP | 3285121 A2 | 2/2018 |
| WO | WO2005/079353 A2 | 9/2005 |
| WO | WO2016/174584 A1 | 11/2016 |

OTHER PUBLICATIONS

Extended European Search Report dated Dec. 21, 2020 in related European Application No. 20182118.8.
Extended European Search Report dated Oct. 2, 2020 in related European Application No. 201730728.
Extended European Search Report dated Sep. 1, 2020 in corresponding European Application No. 20164739.3.
Lewis et al. "Platinum Catalysts Used in the Silicones Industry," Platinum Metals Rev., 1997, 41 (2), 66-75.
Extended European Search Report dated May 25, 2021 in related European Application No. 20182118.8, 15 pages.
Wikipedia, "Silicone rubber," downloaded Jun. 17, 2019 from htttps://en.wikipedia.org/wiki/silicone_rubber, 11 pages.
Gozen et. al. "High-Density Soft-Matter Electronics with Micron-Scale Line Width", Adv. Mater. (2014), 26, 5211-5216.
Joshipura et. al. "Methods to Pattern Liquid Metals", J. Mater. Chem C. (2015), 3, 3834-3841.
Extended European Search Report dated Apr. 9, 2018 in corresponding European Application No. 18154304.2.

* cited by examiner

HYBRID NANOSILVER/LIQUID METAL INK COMPOSITION AND USES THEREOF

CROSS-REFERENCE TO RELATED APPLICATIONS

This application is a divisional application of, and claims priority to U.S. patent application Ser. No. 15/439,754, filed Feb. 22, 2017 (now U.S. Pat. No. 10,492,297), the disclosure of which is hereby incorporated herein by reference.

BACKGROUND

The recent surge in printing beyond 2-D substrates into 3-D space to create so-called 'smart objects,' such as sensors and wearables, is leading to an increased market demand for electrically conductive materials that may be used to print circuit traces and other conductive elements on a range of substrates including plastics. Ideally, the electrically conductive material should also be capable of forming interconnects between electronic components and, e.g., the circuit traces.

Interconnects are the interfaces between conductors, e.g., wires or copper foil traces and electronic components, such as semiconductor devices, e.g., diodes, transistors and integrated circuits. Conventional, robust interconnects are typically formed using anisotropic conductive paste (ACPs), wire bonding or solder. ACPs include nonsolvent, liquid connection materials composed of structurally fine conductive particles diffused in a liquid thermosetting resin. These pastes may be used during Liquid Crystal Display (LCD) manufacturing and for surface mounting electronic components onto printed circuit boards (SMB).

Aluminum or gold wire bonding is also used to form interconnects. An example of how wire bonding is used is shown in FIG. 1. This figure provides a transistor 10, which comprises a silicon die 11, disposed on bonding pads (not shown) on a copper substrate 16. The silicon die 11 is connected by an aluminum bonding wire 13 via a wedge bond 12 to a source terminal 14 or a gate terminal 15. The wedge bond 12 is typically formed by using ultrasound to create a bond between the wire 13 and a terminal 14, 15.

Most typically, however, interconnects are formed using solders. Solders are generally prepared from fusible metal alloys having a melting point below the melting point of the metal parts that are to be joined. Solder is characterized by a melting behavior that does not change substantially with repeated heat/cool cycles. Adhesives and flux are often added to a solder to form a paste, which is disposed at the point of contact to hold the metals in place until the solder is melted or "reflowed" in an oven to make the final connection. The flux in the solder paste is used to promote fusing of the metals and removes and prevents the formation of nonconductive metal oxides, which may reduce the reliability of a soldering connection.

Electronic components may be electrically connected to, e.g., a circuit board using solder balls or bumps. As shown in FIG. 2, for example, solder bumps 28 are used to mount an integrated circuit 25 onto a printed circuit board 29. More particularly, FIG. 2 depicts a flip chip 20, which includes a semiconductor die or integrated circuit 25, which is mounted onto a circuit board 29 via solder bumps 28 coated with flux 26 with the active side of the integrated circuit 25 facing the circuit board 29. The flip chip interconnection is made by contacting the solder bumps 28 of the integrated circuit 25 with corresponding interconnect sites 30 on the circuit board circuitry and then heating to reflow the fusible portion of the solder bumps 28 to make the electrical connection. An underfill 27, such as epoxy, may be used to fill the area between the integrated circuit and the circuit board for additional mechanical strength.

Although solder bumps, ACPs and wire bonds may be effectively used to form interconnects, the processes using these materials generally require high temperature and pressure. Accordingly, interconnects are typically formed on rigid substrates, such as silicon. Consequently, the use of conventional interconnect materials is likely to be of limited use for flexible printed electronics, which typically require flexible plastic substrates that melt at low temperatures, e.g., 150° C.

Other electrically conductive materials known in the art that may be used at low melting temperatures and, thus, may be suitable for use on a wide range of substrates including flexible plastic substrates, may not be suitable for forming interconnects since they often poorly adhere to electronic components. For example, as shown in FIG. 3, nanosilver inks, which typically have a melting temperature ($\leq 145°$ C.) much lower than the bulk metal, are capable of forming conductive elements by bonding (sintering) the silver particles at low temperature. Owing to their low viscosity and high silver content, these ink materials may be deposited on a substrate using a jetting application. Further, nanosilver inks are capable of forming thick films of up to 10-20 μm. Despite these benefits, however, nanosilver inks often do not adhere well to electronic components, thus limiting their use as interconnects. Moreover, nanosilver inks are expensive, further limiting their use.

Liquid metals have also been identified as potentially useful materials for flexible printed electronics. See Joshipura et. al. *J. Mater. Chem C.* (2015), 3, 3834-3841. These metals, which include Gallium, Indium, Bismuth, and Tin, typically have melting points ranging from 10-150° C. Due to their low-melting behaviors, research concerning the use of liquid metals has involved their encapsulation in an effort to control the flow of these materials. See Gozen et. al. *Adv. Mater.* (2014), 26, 5211-5216. For example, FIG. 4 depicts the fabrication of a conductive pattern using a liquid metal and encapsulation of the liquid metal within microchannels. As shown in this scheme, microchannels are molded onto the surface of an elastomer, e.g., poly(dimethylsiloxane) (PDMS) and filled with liquid metal, e.g., eutectic gallium indium (EGaIn). After sealing with an additional layer of PDMS, the liquid-filled channels can function as stretchable circuit wires. Nevertheless, these metals may not be ideal for use as interconnects since a consistent way for electrically contacting the liquid metals to electronic components has not been identified. See Joshipura et. al. *J. Mater. Chem C.* (2015), 3, 3834-3841, 3839-3840.

Consequently, in view of the above, there remains a need in the art for materials that demonstrate good electrical conductivity, are less expensive than nanosilver inks and which are suitable for fabricating interconnects as well as conductive features such as traces, electrodes and the like on a variety of substrates, including plastics.

SUMMARY

The present disclosure is directed to a hybrid conductive ink including: a plurality of silver nanoparticles and a plurality of eutectic low melting point alloy particles, wherein a weight ratio of the eutectic low melting point alloy particles and the silver nanoparticles ranges from 1:20 to 1:5.

Also provided herein is a method of forming an interconnect, including: a) depositing a hybrid conductive ink on a conductive element positioned on a substrate, wherein the hybrid conductive ink includes a plurality of silver nanoparticles and a plurality of eutectic low melting point alloy particles, the plurality of eutectic low melting point alloy particles and the plurality of silver nanoparticles being in a weight ratio from about 1:20 to about 1:5; b) placing an electronic component onto the hybrid conductive ink; and c) heating the substrate, conductive element, hybrid conductive ink and electronic component to a temperature sufficient i) to anneal the plurality of silver nanoparticles in the hybrid conductive ink and ii) to melt the plurality of low melting point eutectic alloy particles to form a melted low melting point eutectic alloy, wherein the melted low melting point eutectic alloy flows to occupy spaces between the annealed plurality of silver nanoparticles, d) allowing the melted low melting point eutectic alloy of the hybrid conductive ink to harden and fuse to the electronic component and the conductive element, thereby forming the interconnect.

The present disclosure also provides an electronic circuit, including: a substrate for supporting the electronic circuit; and a conductive trace for interconnecting a plurality of electronic components dispersed on the electronic circuit, wherein the conductive trace includes at least one bonding pad for interconnecting at least one of the plurality of electronic components to the conductive trace, and wherein the conductive trace includes a hybrid conductive ink including a eutectic low melting point alloy and annealed silver nanoparticles, wherein the eutectic low melting point alloy occupies spaces between the annealed silver nanoparticles.

Also provided herein is an interconnect including a hybrid conductive ink including a eutectic low melting point alloy and annealed silver nanoparticles, wherein said eutectic low melting point alloy occupies spaces between the annealed silver nanoparticles.

DETAILED DESCRIPTION

Figure 1:
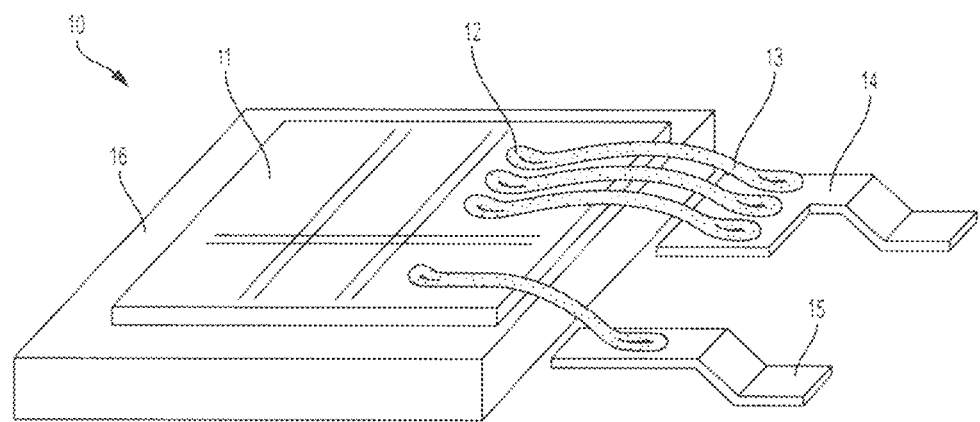
FIG. 1 depicts a transistor with wire bonding forming an interconnect between a silicon wafer and terminals as described in the Background.
Figure 2:
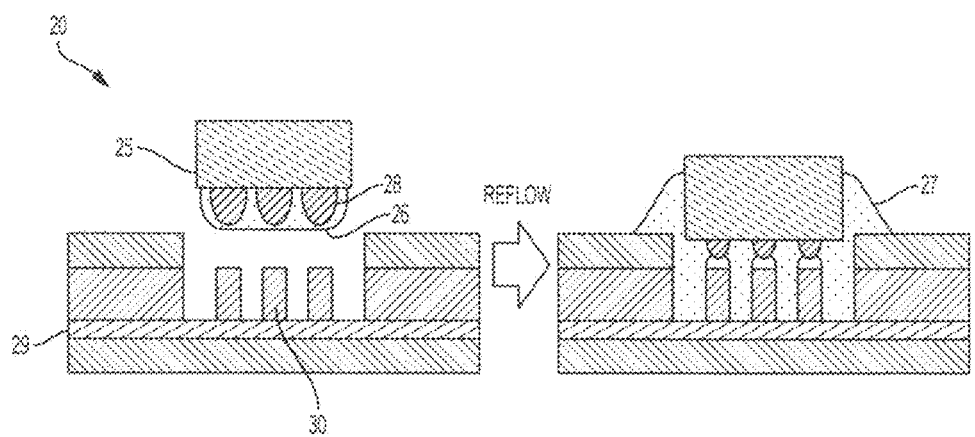
FIG. 2 depicts a flip chip forming an interconnect between an integrated circuit and a conductor positioned on a printed circuit board as described in the Background.
Figure 3:
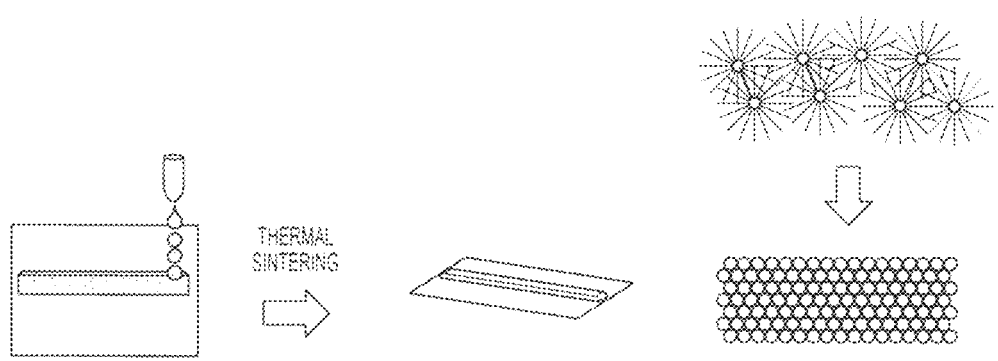
FIG. 3 depicts a scheme showing how a conductive element is fabricated on a substrate using conventional silver nanoparticle inks as described in the Background.
Figure 4:
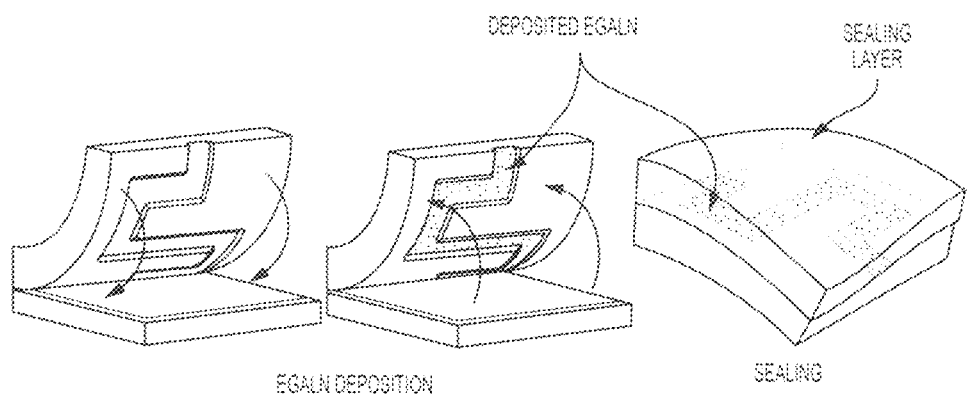
FIG. 4 depicts a method for fabricating a circuit in an elastomeric mold using liquid metals as described in the Background.

The present disclosure is directed to a hybrid conductive ink containing a plurality of silver nanoparticles and a plurality of eutectic low melting point metal particles. These inks retain electrical conductivity comparable to conventional nanosilver inks, even though they may be formulated with up to 20% less silver and, accordingly, can be manufactured at a reduced cost. The present inks are also suitable for use with jetting applications, including aerosol jet printing, and may be used to form self-healing conductive elements at low sintering temperatures. Accordingly, the hybrid conductive inks of the present disclosure are suitable for use with a variety of substrates including low melting point plastics. These hybrid conductive inks, unlike conventional nanosilver inks, are also, surprisingly, useful as a "solder" to form robust interconnects at low temperature.

Silver Nanoparticle Component

The hybrid conductive ink of the present disclosure includes a eutectic low melting point alloy particle component and a silver nanoparticle component. The silver nanoparticle component contains a plurality of silver nanoparticles and optionally a solvent, a stabilizer and/or other additives.

The silver nanoparticles of the present hybrid conductive inks may have any shape or geometry, but are typically spherical. In embodiments, the silver nanoparticles have a volume average particle diameter of from about 0.5 to about 100 nanometers (nm) or from about 1.0 nm to about 50 nm or from about 1.0 nm to about 20 nm. Volume average particle size may be measured by any suitable means, such as a light scattering particle sizer, operated in accordance with the manufacturer's instructions, a Transmission Electron Microscope or a Beckman Coulter Multisizer 3 (Beckman Coulter Inc., Life Sciences Division, Indianapolis, Ind.) operated in accordance with the manufacturer's instructions. Typically, volume average particle size of the present silver nanoparticles is measured via dynamic light scattering using a Malvern Nano ZS Zetasizer model #3600 (Malvern Instruments Ltd. Worcestershire, UK).

In embodiments, the silver nanoparticles of the present hybrid conductive inks have properties distinguishable from those of silver flakes. For example, the silver nanoparticles of the present disclosure can be characterized by enhanced reactivity of the surface atoms and high electrical conductivity. Further, the present silver nanoparticles can have a lower melting point and a lower sintering temperature than silver flakes. The term "sintering" refers to a process in which adjacent surfaces of metal powder particles are bonded by heating, i.e., "annealed." This is in contrast to micron-sized metal flakes, where the mode of conductivity is via ohmic contact through particle-particle touching and overlap. These flake-based inks have conductivities several orders of magnitude lower than sintered nanoparticle conductive inks that melt together.

Due to their small size, silver nanoparticles exhibit a melting point as low as 700° C. below that of silver flakes. In some embodiments, the silver nanoparticles of the hybrid conductive inks may sinter at temperatures more than 800° C. below that of bulk silver. Typically, the silver nanoparticles of the present disclosure sinter at a temperature ranging from about 80° C. to about 250° C., more typically about 145° C. or less, even more typically at about 140° C. or less, such as at about 130° C. or at about 120° C.

The lower melting point of silver nanoparticles is a result of their comparatively high surface-area-to-volume ratio, which allows bonds to readily form between neighboring particles. The large reduction in sintering temperature for nanoparticles enables the formation of highly conductive circuit traces or patterns on flexible plastic substrates since such substrates, e.g., polycarbonate substrates, may melt or soften at a relatively low temperature (for example, 150° C.).

In embodiments, the silver nanoparticles may be elemental silver, a silver alloy, a silver compound or combination thereof. In embodiments, the silver nanoparticles may be a base material coated or plated with pure silver, a silver alloy or a silver compound. For example, the base material may be copper nanoparticles with a silver coating.

Silver alloys of the present disclosure may be formed from at least one metal selected from Au, Cu, Ni, Co, Pd, Pt, Ti, V, Mn, Fe, Cr, Zr, Nb, Mo, W, Ru, Cd, Ta, Re, Os, Ir, Al, Ga, Ge, In, Sn, Sb, Pb, Bi, Si, As, Hg, Sm, Eu, Th Mg, Ca, Sr and/or Ba without limitation. Exemplary metal composites are Au—Ag, Ag—Cu, Au—Ag—Cu, and Au—Ag—Pd. In embodiments, the metal composites may further include a non-metal, e.g., Si, C and Ge. Suitable silver compounds include silver oxide, silver thiocyanate, silver cyanide, silver cyanate, silver carbonate, silver nitrate, silver nitrite, silver sulfate, silver phosphate, silver perchlorate, silver tetrafluoroborate, silver acetylacetonate, silver acetate, silver lactate, silver oxalate and derivatives thereof. Typically, however, the silver nanoparticles are composed of elemental silver.

In addition to silver nanoparticles, the silver nanoparticle component of the present hybrid conductive ink composition may also include an organic vehicle. In embodiments, the constituents of the organic vehicle may be selected by those having ordinary skill in the art, in accordance with the present disclosure for the hybrid conductive ink, to meet specific deposition, processing, adhesion and/or other performance characteristics. For instance, in an application in which the present hybrid conductive ink compositions are employed as a solder paste replacement as described herein, the organic vehicle may be formulated to volatilize during processing. In applications in which the present hybrid conductive ink compositions are employed in adherent coatings on nonmetallic surfaces, the organic vehicle may be selected for adhesive properties.

In some embodiments, the organic vehicle comprises a solvent to disperse the silver nanoparticles. Typically, the solvent is a non-polar organic solvent. Suitable non-polar organic solvents include, for example, hydrocarbons such as an alkane; an alkene; an alcohol having from about 10 to about 18 carbon atoms such as undecane, dodecane, tridecane, tetradecane, hexadecane, 1-undecanol, 2-undecanol, 3-undecanol, 4-undecanol, 5-undecanol, 6-undecanol, 1-dodecanol, 2-dodecanol, 3-dodecanol, 4-dodecanol, 5-dodecanol, 6-dodecanol, 1-tridecanol, 2-tridecanol, 3-tridecanol, 4-tridecanol, 5-tridecanol, 6-tridecanol, 7-tridecanol, 1-tetradecanol, 2-tetradecanol, 3-tetradecanol, 4-tetradecanol, 5-tetradecanol, 6-tetradecanol, 7-tetradecanol, and the like; an alcohol, such as for example, terpineol (α-terpineol), (3-terpineol, geraniol, cineol, cedral, linalool, 4-terpineol, lavandulol, citronellol, nerol, methol, borneol, hexanol heptanol, cyclohexanol, 3,7-dimethylocta-2,6-dien-1ol, 2-(2-propyl)-5-methyl-cyclohexane-1-ol; isoparaffinic hydrocarbons such as, for example, isodecane, isododecane; commercially available mixtures of isoparaffins such as ISOPAR E®, ISOPAR C®, ISOPAR H®, ISOPAR L®, ISOPAR V®, ISOPAR M® manufactured by Exxon Chemical Company Inc. (Spring, Tex.); SHELLSOL® manufactured by Shell Chemical Company (The Hague, The Netherlands); SOLTROL® manufactured by Philips Oil Co., Ltd. (the Woodlands, Tex.); BEGASOL® manufactured by Mobil Petroleum Co., Inc. (Spring, Tex.); IP Solvent 2835 made by Idemitsu Petrochemical Co., Ltd. (Tokyo, JP); naphthenic oils; aromatic solvents such as benzene; nitrobenzene; toluene; ortho-, meta-, and para-xylene, and mixtures thereof; 1,3,5-trimethylbenzene (mesitylene); 1,2-, 1,3- and 1,4-dichlorobenzene and mixtures thereof; trichlorobenzene; cyanobenzene; ethylcyclohexane, phenylcyclohexane and tetralin; aliphatic solvents (such as: hexane; heptane; octane; isooctane; nonane; decane; dodecane); cyclic aliphatic solvents (such as: bicyclohexyl and decalin). In embodiments, two or more non-polar organic solvents may be used as dispersion agents. Typically, the non-polar organic solvents included in the silver nanoparticle component are ethylcyclohexane and phenylcyclohexane.

The non-polar organic solvent(s) may be present in the silver nanoparticle component in an amount, for example, from about 5 weight percent to about 50 weight percent, or from about 10 weight percent to about 40 weight percent or from about 10 weight percent to about 36 weight percent, such as about 26 weight percent, of the nanoparticle silver ink component. As a result, the weight percentage of silver nanoparticles in the silver nanoparticle ink component is from about 95 weight percent to about 50 weight percent or from about 90 weight percent to about 60 weight percent or from about 90 weight percent to about 74 weight percent.

In some embodiments, the organic vehicle comprises one or more stabilizers. In embodiments, the stabilizer(s) may interact with the silver-containing nanoparticles by chemical bond and/or a physical attachment. The chemical bond may take the form of, for example, covalent bonding, hydrogen bonding, coordination complex bonding, ionic bonding or a mixture of different chemical bondings. The physical attachment may take the form of, for example, van der Waals' forces or dipole-dipole interaction or a mixture of different physical attachments. In addition, the stabilizer(s) may be thermally removable, which means that the stabilizer(s) may disassociate from a silver-containing nanoparticle surface under certain conditions, such as through heating or annealing.

Suitable stabilizers include one or more organic stabilizers. Exemplary organic stabilizers can include organoamines such as propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, and N,N,N',N'-tetramethylbutane-1,4-diamine, and the like, or mixtures thereof. In specific embodiments, the silver nanoparticles are stabilized with dodecylamine, tridecylamine, tetradecylamine, pentadecylamine, or hexadecylamine. Other suitable stabilizers as well as methods for preparing stabilized silver nanoparticles are known in the art and disclosed, for example, in U.S. Pat. No. 8,834,965, which is herein incorporated by reference in its entirety.

The weight percentage of the organic stabilizer in the silver nanoparticle component (including only the silver nanoparticles and the stabilizer, excluding the solvent) may be from, for example, about 3 weight percent to about 60 weight percent, from about 5 weight percent to about 35 weight percent, from about 5 weight percent to about 20 weight percent or from about 5 weight percent to about 10 weight percent. As a result, the weight percentage of the silver in the silver nanoparticles may be from about, for example, about 40 weight percent to about 97 weight percent, from about 65 weight percent to about 95 weight percent, from about 80 weight percent to about 95 weight percent, or from about 90 weight percent to about 95 weight percent.

The silver nanoparticle component may further include a resin to improve adhesion to substrates. For example, the silver nanoparticle component may comprise a resin selected from polystyrene, terpene, styrene block copolymers such as styrene-butadiene-styrene copolymer, styrene-isoprene-styrene copolymer, styrene-ethylene/butylene-styrene copolymer, and styrene-ethylene/propylene copolymer, ethylene-vinyl acetate copolymers, ethylene-vinyl acetate-maleic anhydride terpolyrners, ethylene butyl acrylate copolymer, ethylene-acrylic acid copolymer, polyolefins, polybutene, polyamides or the like and mixtures thereof. In embodiments, the resin is present in an amount of from about 0.05 to about 5 percent by weight of the total weight of the silver nanoparticle component. In specific embodiments, the resin is present in an amount of from about 0.1 to about 3 percent by weight of the total weight of the silver nanoparticle component. In other embodiments, the resin is omitted from the silver nanoparticle component.

The silver nanoparticle component may also contain other additives, such as humectants, surfactants and bactericides/fungicides. The additives are typically a small percentage with respect to the composition of the silver nanoparticle component and are used to tune ink properties or to add specific properties as is understood by a skilled artisan. For example, a surfactant may be included in the silver nanoparticle component to reduce the surface tension of the silver component to avoid, e.g., reduced wettability of the substrate to which the conductive ink of the present disclosure may be applied. Viscosity of the silver nanoparticle component may be adjusted to a desired value by including a polymeric thickening agent, e.g., polyvinyl alcohol. Humectants, such as glycols, may also be added to the silver nanoparticle component, e.g., to control evaporation.

The silver nanoparticle hybrid conductive ink component may be prepared by any suitable method. One exemplary method is to disperse the silver nanoparticles into one or more non-polar organic solvents and optionally the stabilizer under inert bubbling. The silver nanoparticle ink component may then be shaken to wet the nanoparticles and then rolled to ensure mixing. The silver nanoparticle ink may then be filtered through a glass fiber and subsequently purged with nitrogen.

Low Melting Point Metal Alloy Particle Component

In embodiments, the present hybrid conductive inks include a eutectic low melting point alloy particle component comprising a plurality of low melting point alloy particles in combination with the silver nanoparticle component as described herein. The term "melting point," as used throughout the present disclosure, refers to the temperature (a point) at which a solid becomes a liquid at atmospheric pressure. The term "alloy" refers to a mixture containing two or more metals, and, optionally, additional non-metals, where the elements of the alloy are fused together or dissolved into each other when molten. The term "eutectic" refers to a mixture or an alloy in which the constituent parts are present in such proportions that the constituents melt simultaneously, and the melting point is as low as possible. Accordingly, a eutectic alloy or mixture solidifies at a single temperature and melts completely at one temperature, the eutectic point. The skilled artisan will appreciate that for a specific combination of two metals, there is typically only one proportion that is eutectic.

Suitable eutectic low melting point alloys for use in the present composition include those eutectic alloys having a melting point lower than that of the melting point of the substrate upon which the instant ink compositions may be deposited and sintered. Typically, the melting points of suitable eutectic low melting point alloys are 140° C. or less, such as about 555° C. to about 75° C. or such as about 60° C.-60.5 C. Such eutectic low melting point alloys may be comprised of appropriate metals, for example, at least two of bismuth, lead, tin, cadmium, zinc, indium and thallium. More typically, however, the eutectic low melting point alloys include at least two of bismuth, tin, indium and gallium. Even more typically, the eutectic low melting point alloy particles of the present disclosure include $In_{51.0}Bi_{32.5}Sn_{16.5}$, i.e., Field's Metal (melting point 60.5° C.), $Bi_{58}Sn_{42}$ (melting point 138° C.), $In_{66.3}Bi_{33.7}$ (melting point 72° C.) or $Bi_{57}Sn_{43}$ (melting point 139° C.). Yet, even more typically, Field's metal is used in the present hybrid conductive inks.

In some embodiments, the eutectic low melting point alloy particle component further includes an organic vehicle, such as an organic solvent and/or a stabilizer as described herein for the silver nanoparticle component. In some embodiments, the organic vehicle comprises an organoamine stabilizer, as described herein, which interacts with the eutectic metal alloy by a chemical bond and/or physical attachment. Typically, butylamine is included in the eutectic low melting point alloy particle component.

The eutectic low melting point alloy particle component may be prepared by any suitable method. One exemplary method is to add centimeter sized chunks of a eutectic low melting point alloy to heated water until the material is molten. Organic vehicle is then added and the mixture is sonicated. The mixture is then cooled and iced. The metal particles may then be isolated by decantation and rinsed.

The average diameter of the eutectic low melting point alloy particles is about 100 micrometers (μm) or less. In embodiments, the average diameter of the eutectic low melting point alloy particles ranges from about 0.5 to about 100 μm or from about 1.0 μm to about 50 μm or from about 1.0 nm to about 30 μm. The average diameter of the particles may be determined by any suitable means, e.g., light microscopy or Scanning Electron Microscopy (SEM).

The Hybrid Conductive Ink

The hybrid conductive ink is prepared by mixing the silver nanoparticle component described herein and the present eutectic low melting point alloy particle component. Typically, the weight ratio of eutectic low melting point alloy to silver nanoparticles in the hybrid conductive ink ranges from about 1:20 (w/w) to about 1:5 (w/w), such as about 1:15 (w/w), such as about 1:10 (w/w). More typically, the weight ratio of a plurality of eutectic low melting point alloy particles to a plurality of silver nanoparticles is 1:5 (w/w).

The hybrid conductive ink of the present disclosure may have any desired viscosity. Typically, the viscosity ranges from about 2 centipoise (cps) to about 200 cps, from about 3 cps to about 100 cps, from about 4 cps to about 50 cps and from about 5 cps to about 20 cps.

Methods of Forming Conductive Elements

The hybrid conductive ink of the present disclosure may be used to fabricate a conductive element, such as conductive traces, conductive bonding pads, electrodes, interconnects and the like.

In embodiments, conductive elements may be formed from the hybrid conductive inks by depositing the hybrid conductive ink onto a substrate and heating the hybrid conductive ink to form annealed silver nanoparticles and melted eutectic low melting point alloy, wherein the melted eutectic low melting point alloy occupies spaces between the annealed silver nanoparticles. In embodiments, the deposited hybrid conductive ink is allowed to dry prior to heating.

Figure 5:
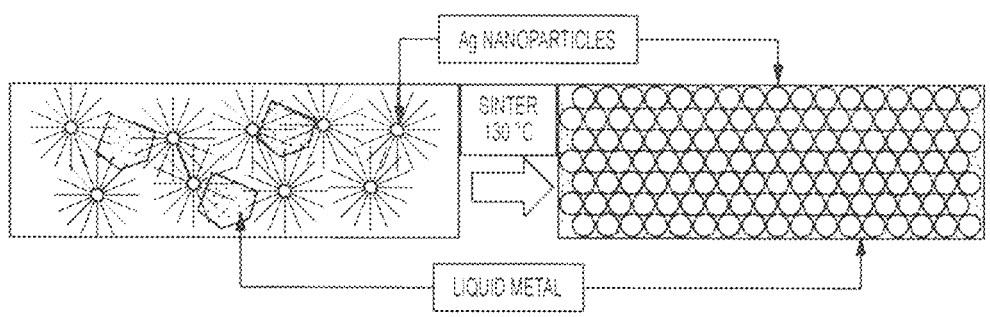
FIG. 5 depicts a method of forming a conductive element using the hybrid conductive ink of the present disclosure as described in the Detailed Description.

FIG. 5 depicts an embodiment of forming a conductive element. In this embodiment, a plurality of silver nanoparticles (spheres with radiating lines) are mixed with a plurality of eutectic low melting point alloy particles (irregular shapes). The mixture is then heated to a temperature sufficient to sinter the silver nanoparticles, e.g., 130° C. Typically, prior to sintering, the hybrid conductive ink of the present disclosure is deposited onto a substrate, such as a plastic substrate as described herein. The deposited conductive ink may be electrically insulating or may have very low electrical conductivity. However, during the sintering process, the silver nanoparticles in the hybrid conductive ink anneal to form a conductive element, which is depicted in FIG. 5 as rows of spheres attached at adjacent surfaces. The eutectic low melting point alloy particles also participate in the process by melting and flowing between the annealed silver nanoparticles to form a conductive 'weld' to the annealed silver.

In some embodiments, the conductive element is a conductive trace on a printed circuit board. As used herein, a printed circuit board is a generic term for completely processed 'printed wiring', where predetermined conductive patterns are used to interconnect electronic components on a common insulating substrate. Printed circuit boards include single-sided, double-sided and multilayer boards made with rigid, flexible and rigid-flex materials. Accordingly, this term is meant to encompass conventional circuit boards including those made from a copper-clad epoxy-glass laminate material, which has been etched to form a pattern of conductive traces, as well as those made from plastic substrates having conductive traces made from conventional nanosilver inks (such as those nansosilver inks described in U.S. Pat. No. 8,158,032, U.S. Publication Nos. 2015/0240100, 2015/0240101 and 2010/0143591, which are each herein incorporated by reference in its entirety) or other metal-containing compositions, the hybrid conductive inks of the present disclosure or combinations thereof.

In embodiments, the hybrid conductive ink of the present disclosure is deposited onto a substrate according to a desired circuit design. The substrate may then be dried and heated at a temperature sufficient to sinter the plurality of silver nanoparticles in the present hybrid conductive ink as described herein to thereby form a conductive trace on the substrate. As used herein, "a temperature sufficient to sinter the plurality of silver nanoparticles" is a temperature sufficient to result in attachment of the silver nanoparticles at adjacent surfaces. A "temperature sufficient to sinter a plurality of silver nanoparticles" typically ranges from about 80° C. to about 250° C., typically about 145° C. or less, more typically at about 140° C. or less, such as at about 130° C. or at about 120° C.

The hybrid conductive ink compositions used in the methods of the disclosure may be deposited onto a substrate or other surface, such as a connective pad as defined herein, by, e.g., solution depositing. Solution depositing as used herein refers to a process whereby a liquid is deposited upon a substrate to form a coating or pattern. Solution depositing includes, for example, one or more of spin coating, dip coating, spray coating, slot die coating, flexographic printing, offset printing, screen printing, gravure printing or ink jet printing.

Typically ink jet printing is used to deposit the hybrid conductive inks of the present disclosure onto a substrate or other surface. More typically, aerosol jet printing is used for deposition. As used herein, "aerosol jet printing" refers to a process that typically involves atomization of the hybrid conductive inks of the present disclosure, producing droplets on the order of one to two microns in diameter. The atomized droplets are typically entrained in a gas stream and delivered to a print head. At the print head, an annular flow of gas is introduced around the aerosol stream to focus the droplets into a tightly collimated beam. The combined gas streams exit the print head through a converging nozzle that compresses the aerosol stream to a small diameter which may be from about 1 micron to about 10 microns. The jet exits the print head and is deposited on a substrate or other surface. The resulting patterns can have features ranging from about 5 microns to about 3000 microns wide, with layer thicknesses from tens of nanometers to about 25 microns, including from about 1 micron to about 20 microns.

The substrates described herein may be any suitable substrate including silicon, a glass plate, a plastic film, sheet, fabric, or synthetic paper. For structurally flexible devices, plastic substrates such as polyester, polycarbonate, polyimide sheets, polyethylene terephthalate (PET) sheets, polyethylene naphthalate (PEN) sheets, and the like, may be used. The thickness of the substrate can be any suitable thickness, such as about 10 micrometers to over 10 millimeters with an exemplary thickness being from about 50 micrometers to about 2 millimeters, especially for a flexible plastic substrate, and from about 0.4 to about 10 millimeters for a rigid substrate such as glass or silicon.

The deposited hybrid conductive ink of the present disclosure is heated to any suitable or desired temperature during sintering, such as from about 80° C. to about 250° C., such as about 120° C., 130° C. or any temperature sufficient to induce annealing of the plurality of silver nanoparticles and thus form an electrically conductive element, which is suitable for use e.g., in electronic devices or a printed circuit board. The heating temperature is one that does not cause adverse changes in the properties of the substrate or any previously deposited layers on the substrate. In some embodiments, use of low heating temperatures allows the use of low cost plastic substrates, which have an annealing temperature of about 150° C. or below.

In various embodiments, the conductive elements, such as a circuit trace or interconnect, are self-healing. Upon damage to the self-healing conductive element, the conductive element containing the flowable eutectic low melting point alloy is also ruptured allowing the flowable eutectic low melting point alloy to flow to the area of damage upon heating. Typically, the flowable conductive eutectic low melting point alloy is able to cure such that it remains in place in the area of damage sustained by the conductive element thereby facilitating electrical conductivity of the conductive element.

In some embodiments, the deposited hybrid conductive ink containing annealed nanoparticles may be heated to any suitable or desired temperature during self-healing, such as from about 140° C. or less, such as about 25° C. to about 75° C. or such as about 55° C. or 60.5° C. or any temperature sufficient to induce melting of the eutectic low melting point alloy. Typically, the eutectic low melting point alloy is Field's metal and the temperature for self healing is between about 60.5° C. to 65° C. Upon cooling, the eutectic low melting point alloy is able to cure such that it remains in place in the area of damage.

The heating for sintering or self-healing can be for any suitable or desired time, such as from about 0.01 hours to about 10 hours, such as about 1 hour. The heating can be performed in air, in an inert atmosphere, for example under nitrogen or argon, or in a reducing atmosphere, for example, under nitrogen containing from about 1 to about 20 percent by volume hydrogen. The heating can also be performed under normal atmospheric pressure or at a reduced pressure of, for example, about 1000 mbars to about 0.01 mbars.

Heating encompasses any technique that can impart sufficient energy to the heated material or substrate to anneal the silver nanoparticles and result in the melting and flow of the eutectic low melting point alloy particles. These techniques include thermal heating (for example, a hot plate, an oven, and a burner), infra-red ("IR") radiation, laser beam, flash light, microwave radiation, or ultraviolet ("UV") radiation, or a combination thereof. Typically, an oven is used for heating.

In some embodiments, after heating and cooling to e.g., room temperature, an electrically conductive element is formed on the substrate that has a thickness ranging from about 0.1 to about 20 micrometers or from about 0.15 to about 10 micrometers. In certain embodiments, after heating and cooling to e.g., room temperature, the resulting electrically conductive element has a thickness of from about 0.1 to about 2 micrometers.

Interconnects and Methods of Forming Interconnects

In some embodiments, the conductive element to be formed is an interconnect. As used herein, an "interconnect" is an interface between a conductive element (typically, wires or copper foil traces or a conductive trace, such as a circuit trace, formed from, for example, a conventional nanosilver ink and/or the hybrid conductive ink of the present disclosure) and an electronic component such as a capacitor, resistor and/or semiconductor devices, e.g., diodes, transistors and integrated circuits. In embodiments, a method of forming an interconnect comprises depositing, such as by aerosol jet printing or other methods as described herein, the hybrid conductive ink of the present disclosure onto a conductive element positioned on a substrate as also described herein. In some embodiments, the hybrid conductive ink of the present disclosure is deposited on at least one bonding pad of a conductive element. As used herein, a "bonding pad", "connective pad" or "conductive pad" is a discrete, identifiable portion of a conductive pattern on a substrate, usually a square, rectangle or circle. Bonding pads may be connected to circuit traces on a printed circuit board or vias underneath the pad, and are used for the electrical connection and mechanical attachment of electronic components, but some may be purely for mechanical attachment with no electrical connection. Typically, the bonding pads are positioned on circuit traces of a printed circuit board.

In some embodiments, an electronic component is placed onto the deposited hybrid conductive ink, which has been deposited onto a conductive element, e.g. a bonding pad. Typically, the electronic component is placed onto the deposited hybrid conductive ink at room temperature. After placement of the electronic component, the assembly is heated, as described herein, to a temperature that is sufficient to anneal the plurality of silver nanoparticles in the hybrid conductive ink and to melt the plurality of low melting point eutectic alloy particles as also described herein. After melting, the low melting point eutectic alloy typically flows to occupy spaces between the annealed silver nanoparticles. Typically, the low melting point eutectic alloy behaves as a solder during heating and thus interacts with the conductor and the electronic component, e.g., the terminations or pins of an electronic component. Thereafter, the temperature is reduced to, for example, room temperature and the eutectic low melting point alloy cools down and hardens to form an interconnect between the conductive element and the electronic component, thus forming e.g., an electronic module or a printed circuit board with electrically attached electronic components.

In some embodiments, the low melting point eutectic alloy begins to melt upon placement of the electronic component onto the hybrid conductive ink, which is positioned on the conductive element. For example, the pressure of applying the electronic component onto the hybrid conductive ink at room temperature may be sufficient to result in the melting of the low melting point eutectic alloy. In other embodiments, the low melting point eutectic alloy does not begin to melt until the assembly comprising the electronic component, hybrid conductive ink, conductive element (such as a circuit trace) and substrate are placed into, e.g., a heated oven at a temperature suitable for sintering the plurality of silver nanoparticles in the hybrid conductive ink.

Figure 6:
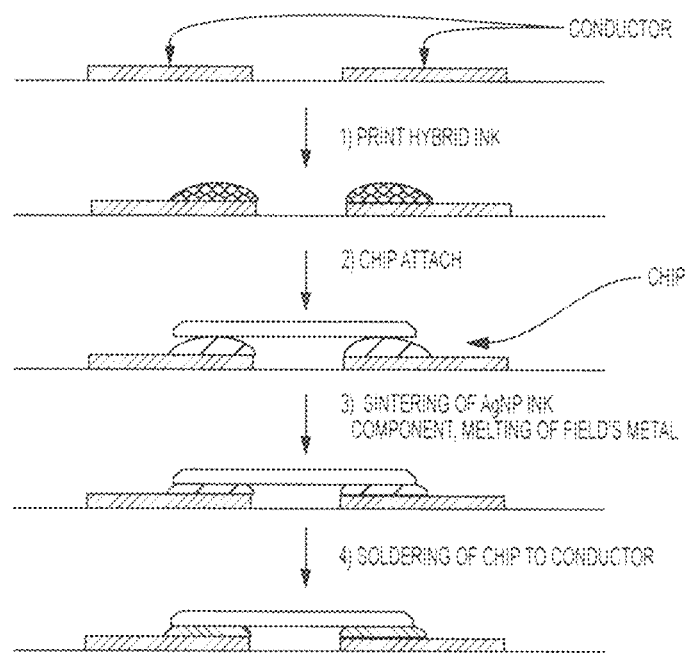
FIG. 6 depicts a method of forming an interconnect between connective pads on a substrate and an integrated circuit (chip) as described in the Detailed Description.

An embodiment of forming an interconnect is depicted in FIG. 6. FIG. 6 depicts a substrate comprising two pads made of a conductive material, e.g., copper foil or the hybrid conductive ink of the present disclosure. FIG. 6 further shows that the instant hybrid conductive ink of the present disclosure is deposited onto the bonding pads by, for example, aerosol jet printing after which an electronic component, such as an integrated circuit, is placed onto the deposited hybrid conductive ink at room temperature. After placement of the integrated circuit, the assembly is heated to 130° C. to sinter the silver nanparticles and to melt the eutectic low melting point alloy particles, e.g. Field's metal. The Field's metal behaves as a solder during heating and thus interacts with the connective pads and the integrated circuit. Upon cooling, the Field's metal hardens to form an interconnect between the connective pads and the integrated circuit.

In some embodiments, the hybrid conductive ink containing annealed nanoparticles may be used as a low temperature solder. In these embodiments, the hybrid conductive ink containing annealed nanoparticles may be heated to any suitable or desired temperature, such as from about 140° C. or less, such as about 25° C. to about 75° C. or such as about 55° C. or about 60.5° C. or any temperature sufficient to induce melting of the eutectic low melting point alloy, such that it may be used to interact with, e.g., an electronic component and a conductive element to form an interconnect after cooling and hardening. Typically, the eutectic low melting point alloy is Field's metal and the temperature for a soldering-like step is between about 60.5° C. to 65° C.

The conductivity of the conductive elements, such as an electrically conductive trace or interconnect, which is produced by heating the deposited hybrid conductive ink of the present disclosure, is more than about 10,000 Siemens/centimeter (S/cm), more than about 50,000 S/cm, more than about 80,000 S/cm, more than about 100,000 S/cm, more than about 125,000 S/cm, more than about 150,000 S/cm or more than about 200,000 S/cm. Typically, the conductivity ranges from about 50,000 S/cm to about 200,000 S/cm, such as about 80,000 S/cm to about 150,000 S/cm, such as about 100,000 S/cm to about 125,000 S/cm.

The resistivity of the conductive elements, such as an electrically conductive trace or interconnect, which is produced by heating the deposited hybrid conductive ink of the present disclosure, is less than about $1.0 \times 10^{-4}$ ohms–centimeter (ohms–cm), less than about $2.0 \times 10^{-5}$ ohms–cm, less than about $1.25 \times 10^{-5}$ ohms–cm, less than about $1.0 \times 10^{-5}$ ohms–cm, less than about $8.0 \times 10^{-6}$ ohms–cm, less than about $6.6 \times 10^{-6}$ ohms–cm or less than about $5.0 \times 10^{-6}$ ohms–cm. Typically, the resistance ranges from about $2.0 \times 10^{-5}$ ohms–cm to about $5.0 \times 10^{-6}$ ohms–cm, such as about $1.25 \times 10^{-5}$ ohms–cm to about $6.6 \times 10^{-6}$ ohms–cm, such as about $1.0 \times 10^{-5}$ ohms–cm to about $8.0 \times 10^{-6}$ ohms–cm. Accordingly, the resistivity of the conductive elements may approach that of bulk silver, e.g., about 4-5× bulk ($10^{-6}$ ohms–cm).

In some embodiments, the resistivity×Bulk Ag of the conductive elements ranges from 3 to 70, such as from 5 to 30 or such as from 5 to 8.

Electronic Circuits

The instant disclosure is also directed to an electronic circuit. Typically, the electronic circuit comprises a printed circuit board. The electronic circuit is supported by a substrate as described herein. In embodiments, the electronic circuit includes a conductive trace for interconnecting a plurality of electronic components as also described herein. In embodiments, one or more electronic components are dispersed on the electronic circuit. The conductive trace includes at least one bonding pad as described herein for interconnecting at least one of the plurality of electronic components to the conductive trace. In some embodiments, the conductive trace is self-healing.

In embodiments, the conductive trace comprises a hybrid conductive ink comprising a eutectic low melting point alloy and annealed silver nanoparticles, wherein said eutectic low melting point alloy occupies spaces between the annealed silver nanoparticles.

In some embodiments, the electronic circuit further comprises a hybrid conductive ink as described herein on the at least one bonding pad and at least one electronic component disposed on the hybrid conductive ink, wherein the hybrid conductive ink comprises a eutectic low melting point alloy as described herein and annealed silver nanoparticles, wherein the eutectic low melting point alloy occupies spaces between the annealed silver nanoparticles. Typically, the eutectic low melting point alloy particles comprise $In_{51.0}Bi_{32.5}Sn_{16.5}$.

EXAMPLES

The following Examples are being submitted to further define various species of the present disclosure. These Examples are intended to be illustrative only and are not intended to limit the scope of the present disclosure. Also, parts and percentages are by weight unless otherwise indicated.

Example 1

Silver Nanoparticle Synthesis and Dispersion to Create an Ink 44 grams (g) of silver nanoparticle dry powder (ash=86.77%) was weighed and gradually added to a 120 milliliter (mL) amber glass bottle containing 5.3 g of ethylcyclohexane and 10.6 g of phenylcyclohexane, then purged with a blanket of nitrogen ($N_2$). The bottle was capped, sealed with tape, and shaken using an orbital mixer at 400 revolutions per minute (RPM) for 4 hours to wet the nanoparticles. Next, the bottle was transferred to an undulating mixer (Movil-Rod) and allowed to roll for 18 hours. Next, the ink was filtered through a 1 micrometer (μM) glass fiber filter into a precleaned 30 mL amber glass bottle. Finally, the filtered ink was purged with $N_2$, and the bottle was capped and sealed with tape.

Example 2

Liquid Metal Powder (Field's Metal) Preparation Process

Figure 7:
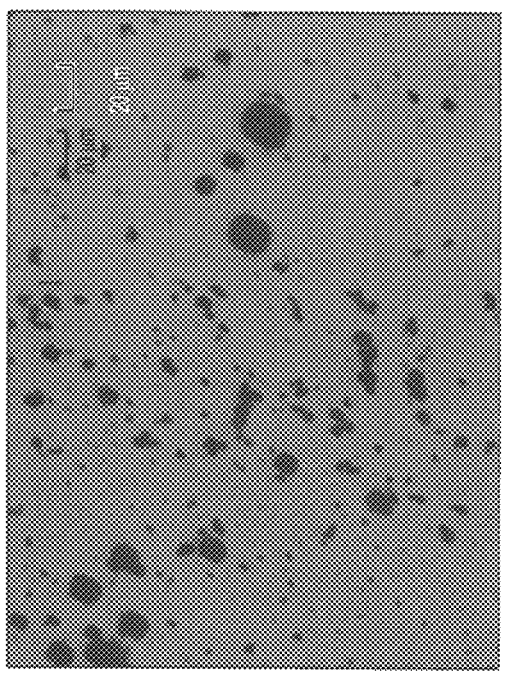
FIG. 7 depicts a photograph of a dispersion of Field's metal particles using light microscopy as described in the Examples.

To a 150 mL beaker was added 250 mL of deionized water and a magnetic stir bar. The water was heated to 70° C. and stirred at 300 RPM. Next, 20 g of Field's metal (Roto144F from Rotometals, San Leandro, Calif.) was added as small centimeter-sized chunks until the material was molten. Next, 60 g of butylamine was added, and an ultrasonic probe mixer (Branson Digital Sonifier 450) was immersed into the suspension. The material was allowed to disperse, and the sonication was continued for 5 minutes. Finally, the dispersion was quenched by cooling to <60° C. to 'freeze' the Field's metal particle size by adding ice to the mixture. Isolation of the Field's metal particles was done by decantation and rinsing with water 4 times. Approximately 15.4 g of particles were recovered and 4.6 g of undispersed Field's metal. Average particle size was 1-30 μm, based on microscope analysis. A photograph of the Field's metal is depicted in FIG. 7.

Example 3

Mixing of Silver Nanoparticle and Field's Metal Particles—Hybrid Ink Preparation To 15 g of the silver nanoparticle ink from Example 1 was added 1.88 g of Field's metal, followed by 17 g of 3 millimeter diameter stainless steel shot. The ratio of Field's metal:silver was 1:5 weight:weight (w:w). The mixture was rolled on the Movil-Rod for 1 hour.

Example 4

Deposition of Materials

The hybrid ink was deposited via aerosol jet printing. Substrates included polycarbonate rigid, polycarbonate thin film, Mylar thin film, and Cycoloy plaques polycarbonate/acrylonitrile-butadiene-styrene (PC/ABS, available from SABIC Inc., Riyadh, Saudi Arabia). Print conditions included a nozzle size of 300 μm, nozzle offset of 3 millimeters (mm), line print speed of 10 mm/second, an admix (bubbler) of ethylcyclohexane, flow rates; Sheath, Atomizer and Exhaust of 50-100, 600-800, 600-775 respectively. Post print, samples sat in air for 30 minutes and were then annealed at either 80° C. (10 minutes), 100° C. or 130° C. in a convection oven for 1 hour. Additionally, bonding pads were printed and 5 kΩ surface mount resistors were placed on the bonding pads immediately after printing (only on polycarbonate rigid). The same annealing procedures as above were then followed to see if electrical connections could be formed from the melting and hardening of the Field's metal to the resistors, acting as a low temperature solder.

Example 5

Electrical Characterization of Hybrid Inks Printed/Sintered Lines 4 point probe (4-p-p) measurements of the printed lines revealed as shown below in Table 1 that the material is non-conductive at 80° C., shows a dramatic increase in conductivity at 100° C. and approaches the pure silver nanoparticle ink conductivity (~4-5 times bulk Ag) at the 130° C. annealing temperature over multiple substrates tested.

TABLE 1

Electrical Characterization of Hybrid AgNP/Field's Metal ink AB2647

| Sintering temperature (° C.) | Resistivity × Bulk Ag* | | | | | |
|---|---|---|---|---|---|---|
| | PET Flex | PC Flex | PC Thin | PC Rigid | Cycoloy | Mylar |
| 80° C. | Non conductive | | | | | |
| 100° C. | 36.5 | 27.1 | 29.3 | 49.5 | 31.1 | 62.6 |
| 130° C. | 5.3 | 7.8 | 6.2 | 8.2 | 29.1 | 12 |

*average of 8 measurements

Figure 8A:
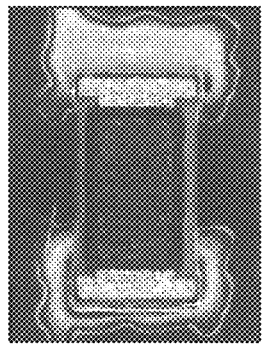
FIG. 8A depicts a resistor electrically attached to conductive pads via the present hybrid conductive ink of the disclosure as described in the Examples.
Figure 8B:
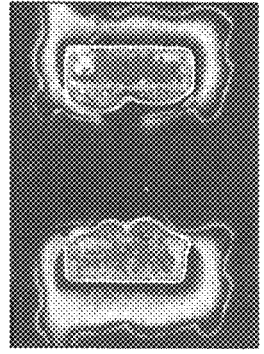
FIG. 8B depicts remaining residue of a hybrid conductive ink of the disclosure on a substrate after deliberate removal of a resistor as described in the Examples.
Figure 8C:
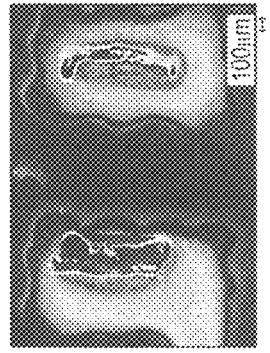
FIG. 8C depicts remaining residue of a conventional nanosilver ink on a substrate after removal of a resistor as described in the Examples.

FIG. 8A depicts the hybrid metal, post annealing with a 5 kΩ resistor. All conductive traces measured the correct 5 kΩ resistance demonstrating that good electrical connections were made. The resistors also showed good adhesion to the substrate. The plaque could be flipped over and tapped against the table with no resistors falling off. Intentionally removing the 5 kΩ resistor resulted in significant ink residue on the substrate as depicted in FIG. 8B. By comparison, for the control prints using pure silver nanoparticle ink, 30/40 resistors fell off after 1 tap on the substrate. FIG. 8C depicts the reduced amount of ink residue left on the substrate after the 5 kΩ resistor fell off upon turning the plaque upside down.

Figure 9A:
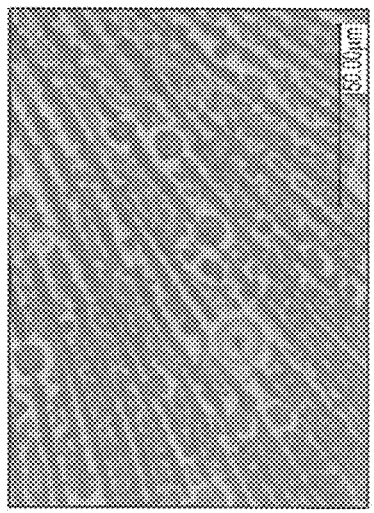
FIGS. 9A and 9B depict optical micrographs of the hybrid conductive ink of the present disclosure (FIG. 9A, 2500× zoom) and a conventional silver nanoparticle ink (FIG. 9B, 1000× zoom) after annealing of the silver nanoparticles as described in the Examples.
Figure 9B:
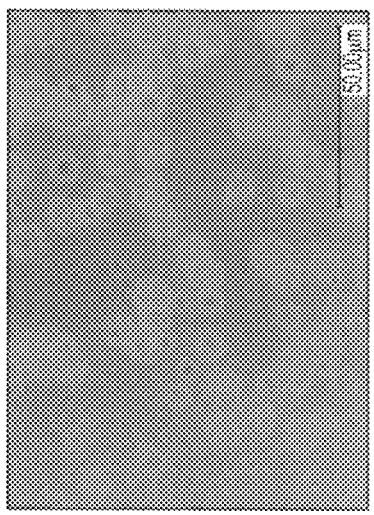

An optical micrograph is provided in FIG. 9A, which shows a printed film of the instant hybrid ink of the present disclosure after sintering. FIG. 9B depicts a conventional nanoparticle ink after sintering. As is evident from FIG. 9A, the addition of the Field's metal results in the presence of Field's metal bands that do not appear in the sintered silver nanoparticle ink of FIG. 9B. Accordingly, the instant hybrid ink of the present disclosure results in an electrically conductive material that is structurally distinguishable from that of conventional silver nanoparticles inks.

What is claimed is:

1. An electronic circuit, comprising:
  a substrate for supporting the electronic circuit; and
  a conductive trace for interconnecting a plurality of electronic components dispersed on the electronic circuit,
  wherein the conductive trace comprises at least one bonding pad for interconnecting at least one of the plurality of electronic components to the conductive trace,
  wherein the conductive trace comprises a hybrid conductive ink comprising a eutectic low melting point alloy and annealed silver nanoparticles, wherein said eutectic low melting point alloy occupies spaces between the annealed silver nanoparticles, and wherein the eutectic low melting point alloy comprises Field's metal $(In_{51.0}Bi_{32.5}Sn_{16.5})$.

2. The electronic circuit of claim 1, wherein a weight ratio of the eutectic low melting point alloy and the annealed silver nanoparticles ranges from 1:20 to 1:5.

3. The electronic circuit of claim 1, a weight ratio of the eutectic low melting point alloy and the annealed silver nanoparticles is 1:5.

4. The electronic circuit of claim 1, wherein the electronic circuit further comprises at least one electronic component and an interconnect between the at least one bonding pad and the at least one electronic component, wherein the interconnect comprises a hybrid conductive ink comprising a eutectic low melting point alloy and annealed silver nanoparticles, wherein said eutectic low melting point alloy occupies spaces between the annealed silver nanoparticles.

5. The electronic circuit of claim 4, wherein the electronic component is selected from the group consisting of an integrated circuit, a transistor and a diode.

6. The electronic circuit of claim 1, wherein the conductive trace is self-healing.

7. The electronic circuit of claim 1, wherein the substrate is a plastic substrate.

8. The electronic circuit of claim 7, wherein the plastic substrate is selected from the group consisting of polyester, polycarbonate, polyimide, polyethylene terephthalate and polyethylene naphthalate (PEN).

* * * * *